(12) United States Patent
Yeh et al.

(10) Patent No.: US 11,158,636 B2
(45) Date of Patent: Oct. 26, 2021

(54) NANOSHEET DEVICE INTEGRATED WITH A FINFET TRANSISTOR

(71) Applicant: INTERNATIONAL BUSINESS MACHINES CORPORATION, Armonk, NY (US)

(72) Inventors: Chun-Chen Yeh, Danbury, CT (US); Ruilong Xie, Niskayuna, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/773,337

(22) Filed: Jan. 27, 2020

(65) Prior Publication Data

US 2021/0233910 A1     Jul. 29, 2021

(51) Int. Cl.
| | |
|---|---|
| *H01L 27/092* | (2006.01) |
| *H01L 29/417* | (2006.01) |
| *H01L 29/78* | (2006.01) |
| *H01L 29/66* | (2006.01) |
| *H01L 29/06* | (2006.01) |
| *H01L 29/49* | (2006.01) |

(52) U.S. Cl.
CPC ...... *H01L 27/0924* (2013.01); *H01L 29/0665* (2013.01); *H01L 29/41791* (2013.01); *H01L 29/4958* (2013.01); *H01L 29/66795* (2013.01); *H01L 29/785* (2013.01); *H01L 2029/7858* (2013.01)

(58) Field of Classification Search
CPC ............... H01L 29/0665; H01L 27/0924
See application file for complete search history.

(56) References Cited

U.S. PATENT DOCUMENTS

| | | |
|---|---|---|
| 8,809,957 B2 | 8/2014 | Bangsaruntip et al. |
| 9,230,989 B2 | 1/2016 | Chang et al. |
| 9,997,519 B1* | 6/2018 | Bao ..................... H01L 29/4966 |
| 10,049,944 B2 | 8/2018 | Beasor et al. |
| 10,074,727 B2 | 9/2018 | Adusumilli et al. |

(Continued)

*Primary Examiner* — Farun Lu
(74) *Attorney, Agent, or Firm* — Cantor Colburn LLP; Randall Bluestone

(57) ABSTRACT

A semiconductor device includes a nanosheet device and a gate-all-around FIN-shaped (GAA-FIN) device. The nanosheet device includes n- and p-type field effect transistor (nFET and pFET) sections, each of which includes nanosheet stacks and work function metal (WFM). Each nanosheet stack includes lowermost and uppermost spacers, intermediate semiconductor layers and dielectric material surrounding the lowermost and uppermost spacers and the intermediate semiconductor layers. The WFM surrounds the nanosheet stacks and entirely fills suspension regions thereof. The GAA-FIN device includes nFET and pFET sections, each of which includes fin elements and WFM. Each fin element includes a lower spacer, a secondary intermediate layer of semiconductor material and dielectric material surrounding the lower spacer and the secondary intermediate layer of semiconductor material. The WFM surrounds each of the fin elements. A thickness of the WFM entirely filling the suspension regions exceeds a thickness of the WFM of the fin elements.

6 Claims, 7 Drawing Sheets

(56) References Cited

U.S. PATENT DOCUMENTS

| | | |
|---|---|---|
| 10,103,065 B1 | 10/2018 | Mochizuki et al. |
| 2015/0364542 A1 | 12/2015 | Rodder et al. |
| 2015/0364546 A1 | 12/2015 | Rodder et al. |
| 2016/0020305 A1 | 1/2016 | Obradovic et al. |
| 2016/0163796 A1 | 6/2016 | Obradovic et al. |
| 2017/0098661 A1 | 4/2017 | Rakshit et al. |
| 2020/0381427 A1* | 12/2020 | Suh .................. H01L 29/42392 |

\* cited by examiner

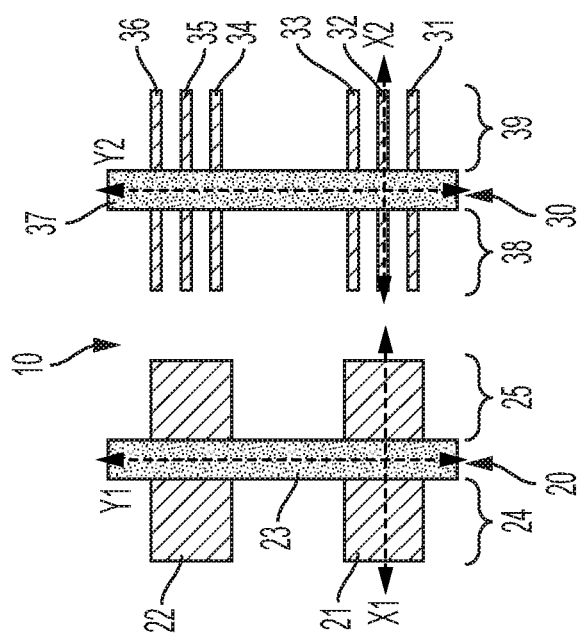
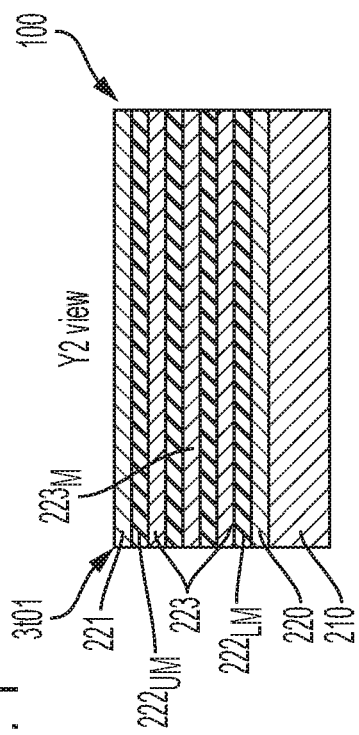
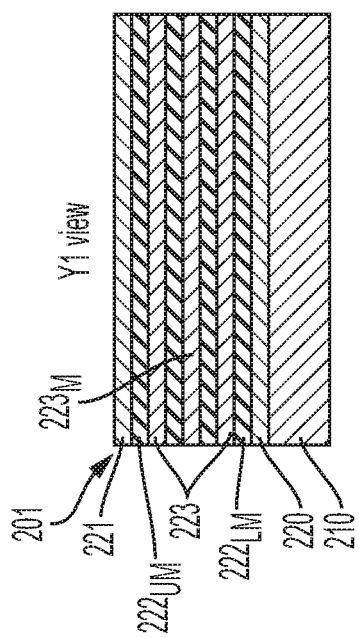
FIG. 1
FIG. 2
FIG. 3

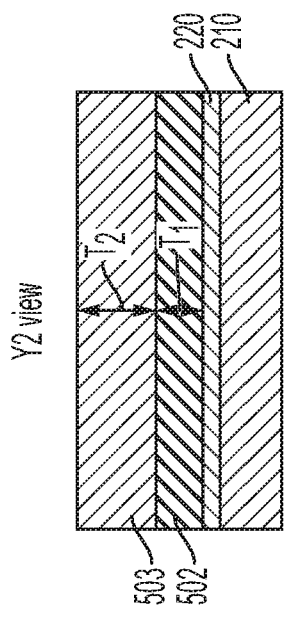
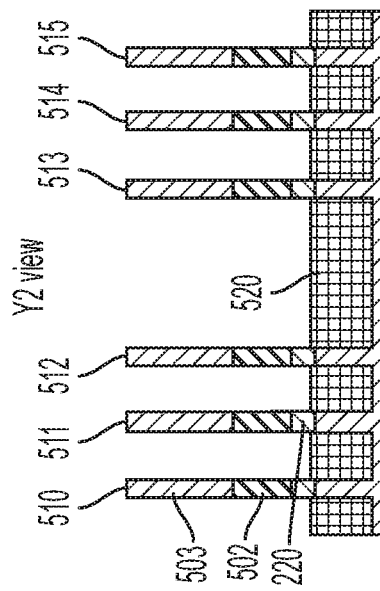
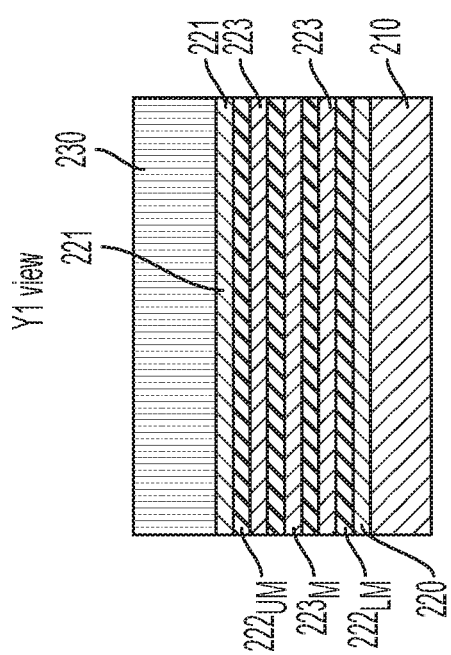
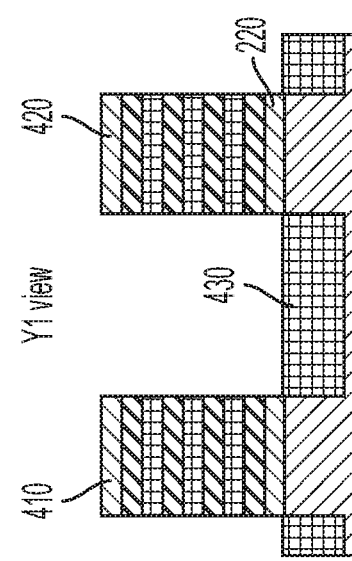

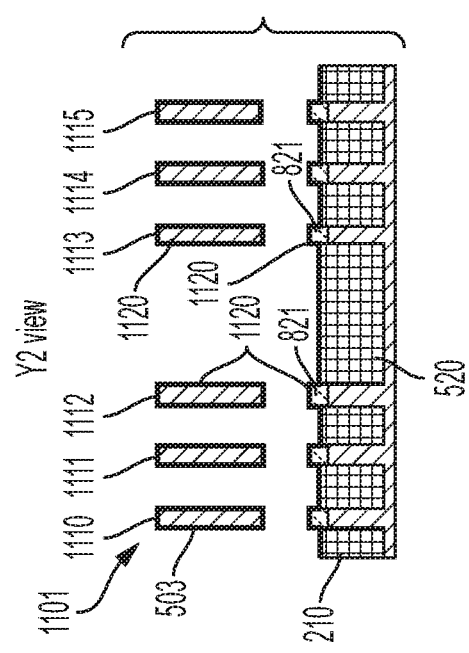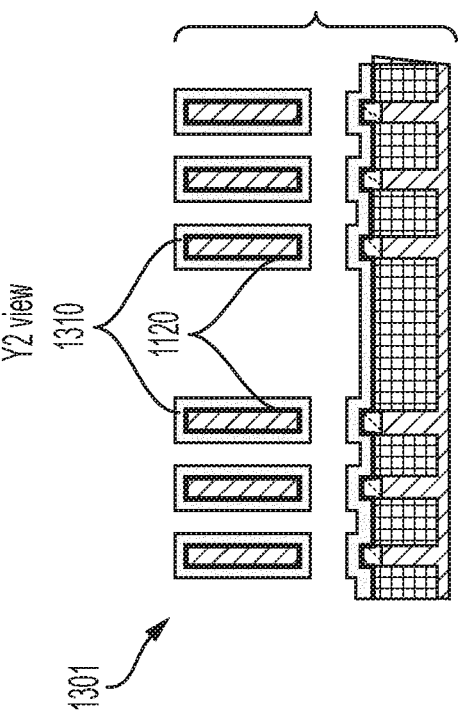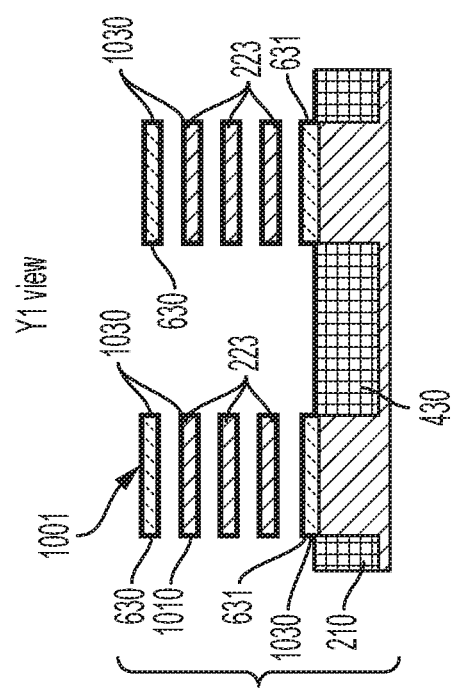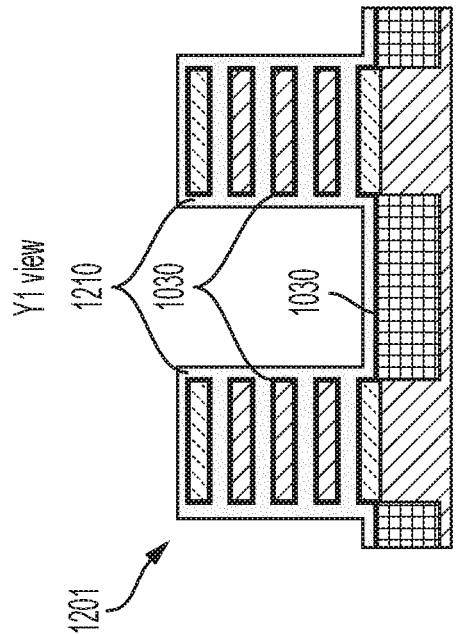

NANOSHEET DEVICE INTEGRATED WITH A FINFET TRANSISTOR

BACKGROUND

The present invention generally relates to fabrication methods and resulting structures for semiconductor devices. More specifically, the present invention relates to extremely-low voltage threshold nanosheet device integration with a fin-type field effect transistor (FINFET).

Conventional integrated circuits incorporate two-dimensional (2D) planar field effect transistors (FETs) in which current flows through a semiconducting channel between a source and a drain in response to a voltage applied to a control gate. To provide better control of the current flow, a variety of three-dimensional (3D) transistor architectures have been developed. In an example 3D transistor known as a FINFET, the planar semiconducting channel of a traditional FET is replaced by a semiconducting fin that extends outward normal to the substrate surface. In such a device, the gate, which controls current flow in the fin, wraps around three sides of the fin. The portion of the fin that is under the gate functions as the channel, and the portions of the fin that are not under the gate function as the source and the drain. Accordingly, the gate in a FINFET influences the current flow through the channel from three surfaces instead of one. The improved control achieved with a 3D design results in faster switching performance and reduced current leakage, which allows 3D transistors to consume less power so that they can operate at a lower supply voltage.

Another type of 3D transistor has now been developed for technology nodes below 10 nm, and is referred to as a gate-all-around (GAA) FET. In these devices, the gate surrounds all four sides of the current channel so as to influence the current flow from every direction and reduce short channel effects (SCE). Instead of providing a fin, in a GAA FET the channel takes the form of one or more silicon nanosheets or nanowires coupling the source and drain regions.

SUMMARY

Embodiments of the present invention are directed to a semiconductor device. A non-limiting example of the semiconductor device includes a nanosheet device and a gate-all-around FIN-shaped (GAA-FIN) device. The nanosheet device includes n- and p-type field effect transistor (nFET and pFET) sections, each of which includes nanosheet stacks and work function metal (WFM). Each nanosheet stack includes lowermost and uppermost spacers, intermediate semiconductor layers and dielectric material surrounding the lowermost and uppermost spacers and the intermediate semiconductor layers. The WFM surrounds the nanosheet stacks and entirely fills suspension regions thereof. The GAA-FIN device includes nFET and pFET sections, each of which includes fin elements and WFM. Each fin element includes a lower spacer, a secondary intermediate layer of semiconductor material and dielectric material surrounding the lower spacer and the secondary intermediate layer of semiconductor material. The WFM surrounds each of the fin elements. A thickness of the WFM entirely filling the suspension regions of the nanosheet stacks exceeds a thickness of the WFM of the fin elements.

Embodiments of the present invention are directed to an integrated circuit (IC) device. A non-limiting example of the IC device includes a nanosheet device characterized in that nanosheet channels are formed between lowermost and uppermost dielectric spacers with uniform spacing and a gate-all-around fin-shaped (GAA-FIN) device characterized in that fin elements have lowermost dielectric spacers and an absence of uppermost dielectric spacers. The uniform spacing of the nanosheet device is less than a spacing between the fin elements of the GAA-FIN device.

Embodiments of the invention are directed to a method for fabricating a semiconductor device with nanosheet and gate-all-around FIN-shaped (GAA-FIN) devices. A non-limiting example of the method includes assembling, in the nanosheet device, nanosheet stacks including lowermost and uppermost spacers, intermediate semiconductor layers and dielectric material surrounding the lowermost and uppermost spacers and the intermediate semiconductor layers, depositing work function metal (WFM) to surround and entirely fill the nanosheet stacks with the nanosheet stacks exhibiting a pinch-off effect in suspension regions thereof. The method further includes assembling, in the GAA-FIN device, fin elements including a lower spacer, a secondary intermediate layer of semiconductor material and dielectric material surrounding the lower spacer and the secondary intermediate layer of semiconductor material and depositing WFM to surround the fin elements. The depositing of the WFM is executed such that a thickness of the WFM of the nanosheet stacks exceeds a thickness of the WFM of the fin elements.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1 is a top-down view of a semiconductor device structure with nanosheet and GAA-FIN devices in accordance with embodiments of the present invention;

FIG. 2 is an illustration of an initial structure taken along the axis Y1 of FIG. 1 in accordance with embodiments of the present invention;

FIG. 3 is an illustration of an initial structure taken along the axis Y2 of FIG. 1 in accordance with embodiments of the present invention;

FIG. 4 depicts a hard mask block formed on the initial structure of FIG. 2 viewed along a same perspective as that of FIG. 2 in accordance with embodiments of the present invention;

FIG. 5 depicts recession and regrowth executed with respect to the initial structure of FIG. 3 viewed along a same perspective as that of FIG. 3 in accordance with embodiments of the present invention;

FIG. 6 is an illustration of a first intermediate structure viewed along a same perspective as that of FIGS. 2 and 4 in accordance with embodiments of the present invention;

FIG. 7 is an illustration of a first intermediate structure viewed along a same perspective as that of FIGS. 3 and 5 in accordance with embodiments of the present invention;

FIG. 12 is an illustration of a late stage structure viewed along a same perspective as that of FIG. 9 in accordance with embodiments of the present invention;

FIG. 13 is an illustration of a late stage structure viewed along a same perspective as that of FIG. 11 in accordance with embodiments of the present invention;

FIG. 14 is an illustration of a secondary late stage structure viewed along a same perspective as that of FIG. 12 in accordance with embodiments of the present invention;

FIG. 15 is an illustration of a secondary late stage structure viewed along a same perspective as that of FIG. 13 in accordance with embodiments of the present invention;

Figure 9:
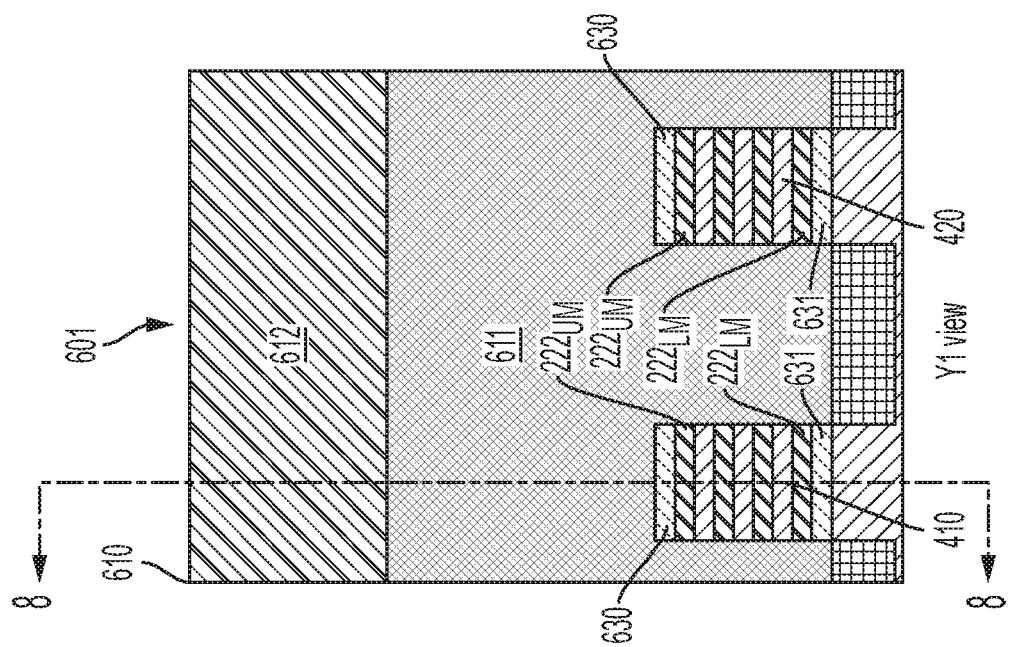
FIG. 9 is an illustration of the secondary intermediate structure of FIG. 8 and is viewed along a same perspective as that of FIG. 6 in accordance with embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, while nanosheet devices provide a solution for a further device performance boost as compared to FINFET devices and gate-all-around (GAA) FINFETs (GAA-FINs) because of superior short channel (SC) control and relatively large effective channel width (Weff), certain limitations remain. In particular, nanosheet devices with multiple voltage thresholds (i.e., eight voltage thresholds (Vt): four Vt pairs) has been difficult to implement. This is because such a configuration typically involves very complex integration and patterning processes and because development costs for nanosheet devices with multiple Vt can be high with a low process window and low tolerance.

Turning now to an overview of the aspects of the invention, one or more embodiments of the invention address the above-described shortcomings of the prior art by providing an integrated circuit device with both nanosheet and GAA-FIN devices. For the nanosheet devices, nanosheet channels are located between upper and lower dielectric layers whereas, for the GAA-FIN devices, there is only a lower dielectric layer and no upper dielectric layer. Also, the space between the nanosheets in the nanosheet devices is less than space between the GAA-FINs in the GAA-FINs devices and can be substantially equal in size to the space between the upper dielectric layer and a top-most nanosheet layer and the space between the lower dielectric layer and a bottom-most nanosheet layer.

The above-described aspects of the invention address the shortcomings of the prior art by providing for an integrated circuit device in which the nanosheet devices (nFET and pFET) have pinched-off characteristics. For the purposes of this disclosure, the term "pinched-off" refers to situations in which suspension regions (defined as a space or gap between nanosheets) are fully filled with gate insulator and work function metals and have an absence of low-resistance metal filling. Thus, where nanosheet devices have "pinched-off" characteristics, they exhibit or include relatively thick work function metal (WFM) and reduced Vt. By contrast, the GAA-FIN devices integrated with the nanosheet devices in the integrated circuit do not exhibit this "pinched-off" effect. As an additional feature, for the nanosheet devices, top-most and bottom-most nanosheet layers see a same gate stack.

The presence of nanosheet devices and GAA-FIN devices in the integrated circuit device is beneficial because nanosheet devices are not necessarily needed for all devices in the circuit. That is, nanosheet devices, such as those nanosheet devices with extremely-low Vt (XLVT) and highest performance, might only need to be used at critical paths. In those cases, it will still be possible to achieve very good overall performance gains.

Turning now to a more detailed description of aspects of the present invention, FIG. 1 is a top-down view of a semiconductor device 10 including a nanosheet device 20 and a FINFET or GAA-FIN device 30. The nanosheet device 20 includes first and second nanosheet sections 21 and 22 as well as a gate structure 23 with an nFET section 24 and a pFET section 25. The GAA-FIN device 30 includes fins 31-36 as well as a gate structure 37 with an nFET section 38 and a pFET section 39. It is to be understood that the arrangements of the nFET and pFET sections can be reversed from what is shown in the drawings and described herein. It is to be further understood, however, that the following description with relate to the case already shown and described. This is being done for clarity and brevity and should not be interpreted as limiting in any way. The nanosheet device 20 can be provided as an extremely-low voltage threshold (XLVT) device as described below or as a low-voltage threshold device (LVT) and the GAA-FIN device 30 can be provided as one or more of an LVT, a regular- or a high-voltage threshold (LVT, RVT, HVT) device.

The following description will relate to processes involved in the formation of the semiconductor device 10 and will refer to FIGS. 2-15 along the X1 or Y1 axes for the nanosheet device 20 or a preceding figure or along the X2 or Y2 axes for the GAA-FIN device 30 or a preceding figure. In each case, the accompanying text will make clear which axis is associated with the figure being discussed.

With reference to FIGS. 2 and 3, which are viewed along the Y1 and Y2 axes for the nanosheet device 20 and the GAA-FIN device 30, initial structures 201 and 301 each include a substrate 210, which can be formed of silicon (Si) or another similar semiconductor material, a lowermost layer 220 of silicon-germanium 65 (SiGe65), an uppermost layer 221 of SiGe65 and intermediate layers 222 of silicon-germanium 30 (SiGe30) that are interleaved with Si layers 223 between the lowermost layer 220 and the uppermost layer 221.

In initial structures 201 and 301 and with an odd number of the intermediate layers 222, there can be vertical symmetry below and above the middle Si layer 223M whereby the lowermost layer 220 of the SiGe65 is adjacent to the lowermost one of the intermediate layers $222_{LM}$ of SiGe30 and the uppermost layer 221 of the SiGe65 is adjacent to the uppermost one of the intermediate layers $222_{UM}$ of SiGe30. In addition, while suspension thicknesses in conventional nanosheet device configurations is about ~10 nm, the thickness of each of the Si layers 223 is about ~7 nm.

In accordance with embodiments of the present invention, the thicknesses of each of the lowermost layer 220 of SiGe65, the uppermost layer 221 of SiGe65 and the intermediate layers 222 of SiGe30 that are interleaved with the Si layers 223 can be substantially similar or equal. As such, each layer can have a thickness of about ~7 nm.

With continued reference to FIGS. 2 and 3 and with additional reference to FIGS. 4 and 5, a silicon nitride (SiN) block 230 is formed as a hard mask on the uppermost layer 221 in the initial structure 201 of FIG. 2 and, in the initial structure 301 of FIG. 3, the uppermost layer 221, the Si layers 223 and the intermediate layers 222, including the lowermost one of the intermediate layers $222_{LM}$ are recessed. Subsequently, the lowermost one of the intermediate layers $222_{LM}$ and a Si layer 223 are regrown to form secondary intermediate layer 502 and secondary Si layer 503.

A thickness T1 of the secondary intermediate layer 502 can be between about ~20 to about ~35 nm. A thickness T2 of the secondary Si layer 503 can be between about ~30 to about ~40 nm.

With reference to FIGS. 6 and 7, first intermediate structures 401 and 501 are provided and are viewed along the same perspective as those of FIGS. 2 and 3 and FIGS. 4 and 5. As shown in FIGS. 6 and 7, the first intermediate structures 401 and 501 result from FIN patterning and shallow trench isolation (STI) formation following the formation of the SiN block 230 as shown in FIG. 4 and the recession and regrowth of FIG. 5. As shown in FIG. 6, the FIN patterning and the STI formation results in the first intermediate structure 401 including first stack 410 and second stack 420 that each include remnants of the layering of FIG. 2 where the first stack 410 and the second stack 420 are separated by STI 430 formed in the substrate 210. As shown in FIG. 7, the FIN patterning and the STI formation results in the second intermediate structure 501 including fin elements 510-515 that are separated by STIs 520 formed in the substrate 210. Each of the fin elements 510-515 includes remnants of the lowermost layer 220, the secondary intermediate layer 502 and the secondary Si layer 503.

Figure 8:
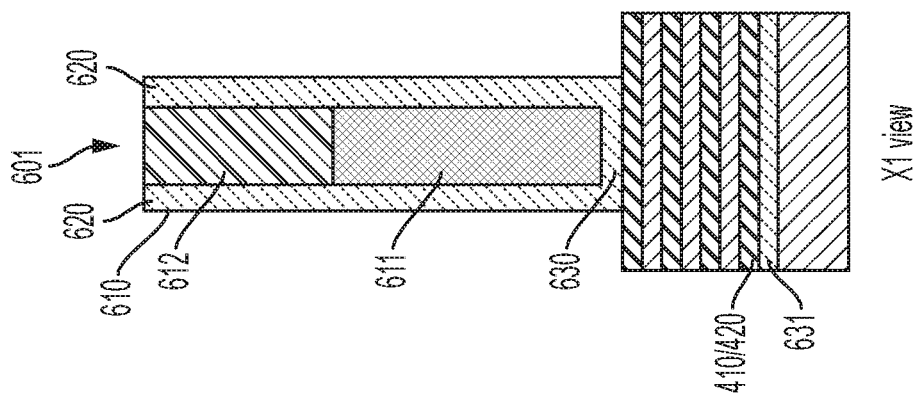
FIG. 8 is an illustration of a secondary intermediate structure and is a cross-sectional view of FIG. 9 taken along line 8-8 of FIG. 9 in accordance with embodiments of the present invention.

With reference to FIGS. 8 and 9, secondary intermediate structure 601 is formed as a result of dummy gate formation and SiGe65 removal, which removes the remnant of the uppermost layer 221 of SiGe65, and subsequent spacer formation. FIG. 9 is a view of the secondary intermediate structure 601 along a same perspective as that of FIG. 6 and FIG. 8 is a cross-sectional view of FIG. 9.

As shown in FIG. 8, the dummy gate formation results in the formation of a dummy gate structure 610 that includes a dummy gate layer 611 and a hard mask layer 612 of SiN and the spacer formation results in vertical spacers 620 being formed along sidewalls of the dummy gate layer 611 and the hard mask layer 612 as well as horizontal spacers 630 and 631. The horizontal layers 630 are formed between a lowermost surface of the dummy gate layer 611 and proximal portions of the remnants of the uppermost one of the intermediate layers $222_{UM}$ of SiGe30 in the first and second stacks 410 and 420. The horizontal spacers 631 are formed between an uppermost surface of the substrate 210 and the remnants of the lowermost one of the intermediate layers $222_{LM}$ of SiGe30 in the first and second stacks 410 and 420. Thus, the horizontal spacer 630 effectively fills in the spaces previously occupied by the remnants of the lowermost layer 220 and the uppermost layer 221 of SiGe65 that were removed after gate patterning and before spacer deposition.

As shown in FIG. 9, the dummy gate formation results in the formation of the dummy gate structure 610 that includes the dummy gate layer 611 and the hard mask layer 612 and the spacer formation results in the formation of the horizontal spacers 630 and 631. The horizontal spacers 630 are formed between the lowermost surface of the dummy gate layer 611 and proximal portions of the remnants of the uppermost one of the intermediate layers $222_{UM}$ of SiGe30 in the first and second stacks 410 and 420. The horizontal spacers 631 are formed between the substrate 210 and the remnants of the lowermost one of the intermediate layers $222_{LM}$ of SiGe30 in the first and second stacks 410 and 420. Thus, as above, the horizontal spacers 630 and 631 effectively fill in the spaces previously occupied by the remnants of the lowermost layer 220 and the uppermost layer 221 of SiGe65 that were removed after gate patterning and before spacer deposition.

The horizontal spacers 630 and 631 are therefore formed over and under the remnants of the first and second stacks 410 and 420 (i.e., the nanosheet stacks).

Figure 11:
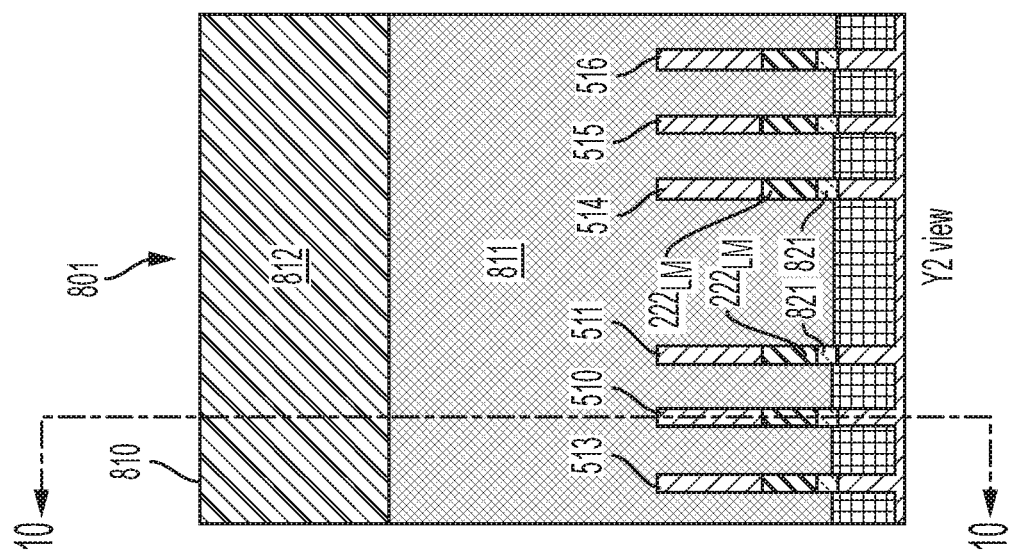
FIG. 11 is an illustration of the secondary intermediate structure of FIG. 10 and is viewed along a same perspective as that of FIG. 7 in accordance with embodiments of the present invention.
Figure 10:
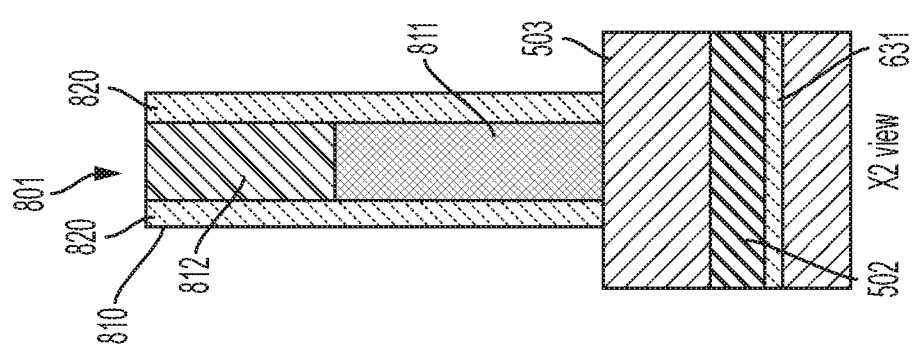
FIG. 10 is an illustration of a secondary intermediate structure and is a cross-sectional view of FIG. 11 taken along line 10-10 of FIG. 11 in accordance with embodiments of the present invention.

With reference to FIGS. 10 and 11, secondary intermediate structure 801 is formed as a result of the gate formation and the subsequent spacer formation. FIG. 11 is a view of the secondary intermediate structure 801 along a same perspective as that of FIG. 7 and FIG. 10 is a cross-sectional view of FIG. 11.

As shown in FIG. 10, the dummy gate formation results in the formation of a dummy gate structure 810 that includes a dummy gate layer 811 and a hard mask layer 812 of SiN and the spacer formation results in vertical spacers 820 being formed along sidewalls of the dummy gate layer 811 and the hard mask layer 812 and horizontal spacers 821 being formed between the substrate 210 and the remnants of the lowermost one of the intermediate layers $222_{LM}$ of SiGe30 in the fin elements 510-515. In this case, the hard mask layer 812 and the vertical spacers 820 extend to an uppermost surface of the secondary Si layer 503.

As shown in FIG. 11, the gate formation results in the formation of the dummy gate structure 810 that includes the dummy gate layer 811 and the hard mask layer 812 and the spacer formation results in the formation of the horizontal spacers 821 between the substrate 210 and the remnants of the secondary intermediate layer 502 of SiGe30 in the fin elements 510-515. Thus, as above, the horizontal spacers 821 effectively fill in the spaces previously occupied by the remnants of the secondary intermediate layer 502 that were removed after gate patterning and before spacer deposition.

With reference to FIGS. 12 and 13, late stage structures 1001 and 1101 are provided and are viewed along same perspectives as those of FIGS. 9 and 11. The late stage structures 1001 and 1101 result from FIN recess and inner spacer formation operations followed by source/drain (S/D) epitaxial growth operations executed with respect to the secondary intermediate structure 601 of FIGS. 8 and 9 and the secondary intermediate structure 801 of FIGS. 10 and 11, subsequent interlayer dielectric (ILD) deposition and poly-open chemical-mechanical polish (POC) operations and finally dummy gate removal, SiGe release and high-k (HK) dielectric deposition operations.

As shown in FIG. 12, the late stage structure 1001 includes the substrate 210, the STI elements 430 and first and second stack remainders 1010 and 1020. The first and second stack remainders 1010 and 1020 each include horizontal spacer 631, now-suspended Si layers 223 and horizontal spacer 630. An HK layer 1030 is disposed on the STI elements 430, exposed surfaces of the horizontal spacers 631 and exposed surfaces of the now-suspended Si layers 223 and the horizontal spacer 630.

As shown in FIG. 13, the late stage structure 1101 includes the substrate 210, the STI elements 520 and fin element remainders 1110-1115. The fin element remainders 1110-1115 each include horizontal spacer 821 and now-suspended secondary Si layer 503. An HK layer 1120 is disposed on the STI elements 520, exposed surfaces of the horizontal spacers 821 and exposed surfaces of the now-suspended secondary Si layer 503.

With reference to FIGS. 14 and 15, secondary late stage structures 1201 and 1301 are provided and are viewed along same perspectives as those of FIGS. 12 and 13. The secondary layer stage structures 1201 and 1301 result from work function metal (WFM) deposition executed with respect to the late stage structures 1001 and 1101 of FIGS. 12 and 13 whereby first WFM 1210 is disposed on the HK layer 1030 and surrounds and entirely fills in the first and second stack remainders 1010 and 1020 of FIG. 12 and whereby first WFM 1310 is disposed on the HK layer 1120 and surrounds the HK layer 1120 on each of the fin element remainders 1110-1115 of FIG. 13.

Notably, due to a pinch-off of the suspension region in the secondary late stage structure 1201 whereby a suspension region as defined above is fully filled with gate insulator and WFM and has an absence of low-resistance metal filling, the interlayer portions of the first WFM 1210 in the first and second stack remainders 1010 and 1020 of FIG. 12 are relatively thick as compared to the thickness of the first WFM 1310 surrounding the HK layer 1120 on each of the fin element remainders 1110-1115 of FIG. 13 in the secondary late stage structure 1301 of FIG. 15. This provides a nanosheet device 20 (see FIG. 1), which is eventually formed from the secondary late stage structure 1201, with a lower voltage threshold as compared the GAA-FIN device 30 (see FIG. 1), which is eventually formed from the secondary late stage structure 1301.

To an extent that the GAA-FIN device 30 eventually formed from the secondary late stage structure 1301 is an LVT device, it is seen that the nanosheet device 20 eventually formed from the secondary late stage structure 1201 is an XLVT device.

Figure 17:
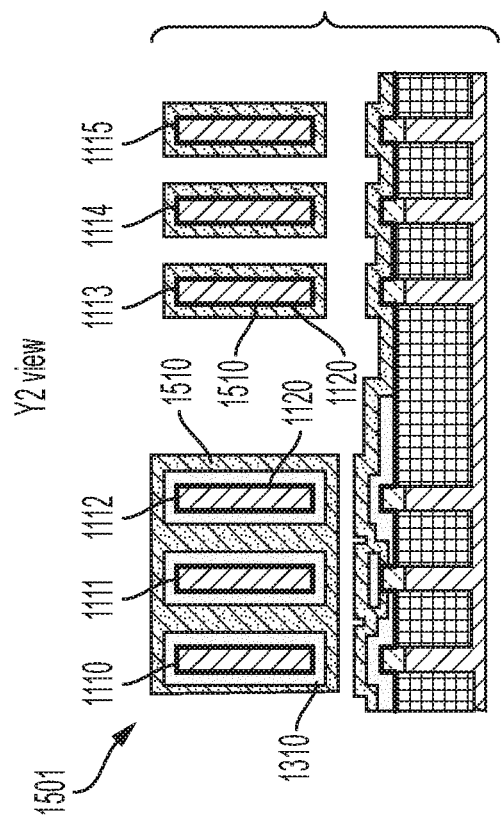
FIG. 17 is an illustration of a tertiary late stage structure viewed along a same perspective as that of FIG. 15 in accordance with embodiments of the present invention.
Figure 16:
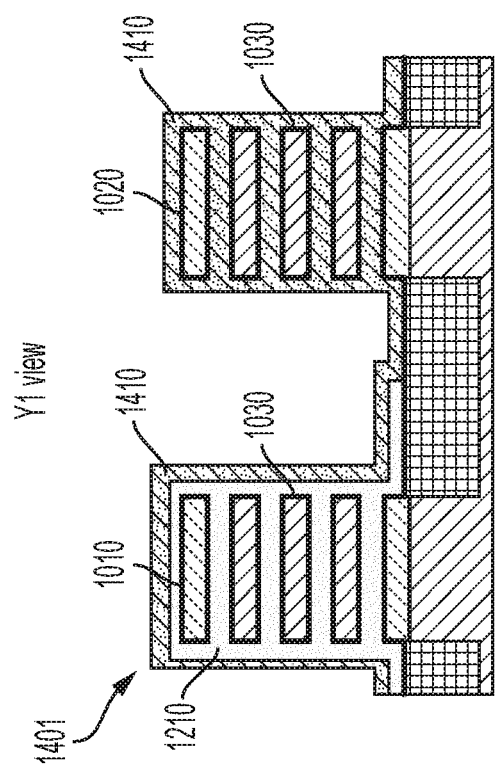
FIG. 16 is an illustration of a tertiary late stage structure viewed along a same perspective as that of FIG. 14 in accordance with embodiments of the present invention.

With reference to FIGS. 16 and 17, tertiary late stage structures 1401 and 1501 are provided and are viewed along same perspectives as those of FIGS. 14 and 15. The tertiary layer stage structures 1401 and 1501 result from WFM patterning operations of removing first WFM from one type of device (e.g., removing pFET WFM from NFET side), followed by a second WFM (e.g., nFET WFM) deposition executed with respect to the secondary late stage structures 1201 and 1301 of FIGS. 14 and 15. Second WFM 1410 (e.g., nFET WFM) is thereby disposed on the remnant of the first WFM 1210 of the first stack remainder 1010 and on the HK layer 1030 to surround and entirely fill in the second stack remainder 1020. Similarly, second WFM 1510 is thereby disposed on the remnant of the first WFM 1310 of each of the fin elements 1110-1112 and on the HK layer 1120 to surround the HK layer 1120 of each of the fin element remainders 1113-1115.

Notably, due to a pinch-off of the suspension region in the tertiary late stage structure 1401 whereby a suspension region as defined above is fully filled with gate insulator and WFM and has an absence of low-resistance metal filling, the interlayer portions of the second WFM 1410 in the second stack remainder 1020 are relatively thick as compared to the thickness of the second WFM 1510 surrounding the HK layer 1120 of each of the fin element remainders 1113-1115 in the secondary late stage structure 1501. This again provides the nanosheet device 20 (see FIG. 1), which is eventually formed from the tertiary late stage structure 1401, with a lower voltage threshold as compared to the GAA-FIN device 30 (see FIG. 1), which is eventually formed from the tertiary late stage structure 1501.

In accordance with embodiments of the present invention, the WFM 1210 and the WFM 1410 can be different materials. In any case, the WFM 1210 completely surrounds respective entireties of the nanosheet channels in the nFET section of the nanosheet device 20 (see FIG. 1) and the WFM 1410 completely surrounds respective entireties of the nanosheet channels in the pFET section of the GAA-FIN device 30 (see FIG. 1).

The pinch-off effect noted above with reference to FIGS. 12 and 13 and with reference to FIGS. 16 and 17 can be increased by the reduced distance between each of the now-suspended Si layers 223 (i.e., the nanosheet channels) in the first and second stack remainders 1010 and 1020 resulting from the reduced thicknesses of each of the layers in the original first and second stacks 410 and 420 (see FIG. 6) as compared to the horizontal distance between each of the fin elements 510-512 and 513-515 (see FIG. 7).

It is to be understood that, while there is a pinch-off effect observed in the second WFM 1510 between each of the fin element remainders 1110-1112 of the tertiary late stage structure 1501 of FIG. 17, the thickness of the second WFM 1510 in this case is distinguished from the thicknesses of the first WFM 1210 and the second WFM 1410 in the tertiary late stage structure 1401 in that the pinch-off effect results from a layering of both the first WFM 1310 and the second WFM 1510.

Final structures can be provided to thus arrive at the nanosheet device 20 and the GAA-FIN device 30 of FIG. 1. These final structures can result from gate formation operations whereby gate metal and a subsequent cap layer are deposited over the tertiary late stage structures 1401 and 1501 of FIGS. 16 and 17.

Figure 18:
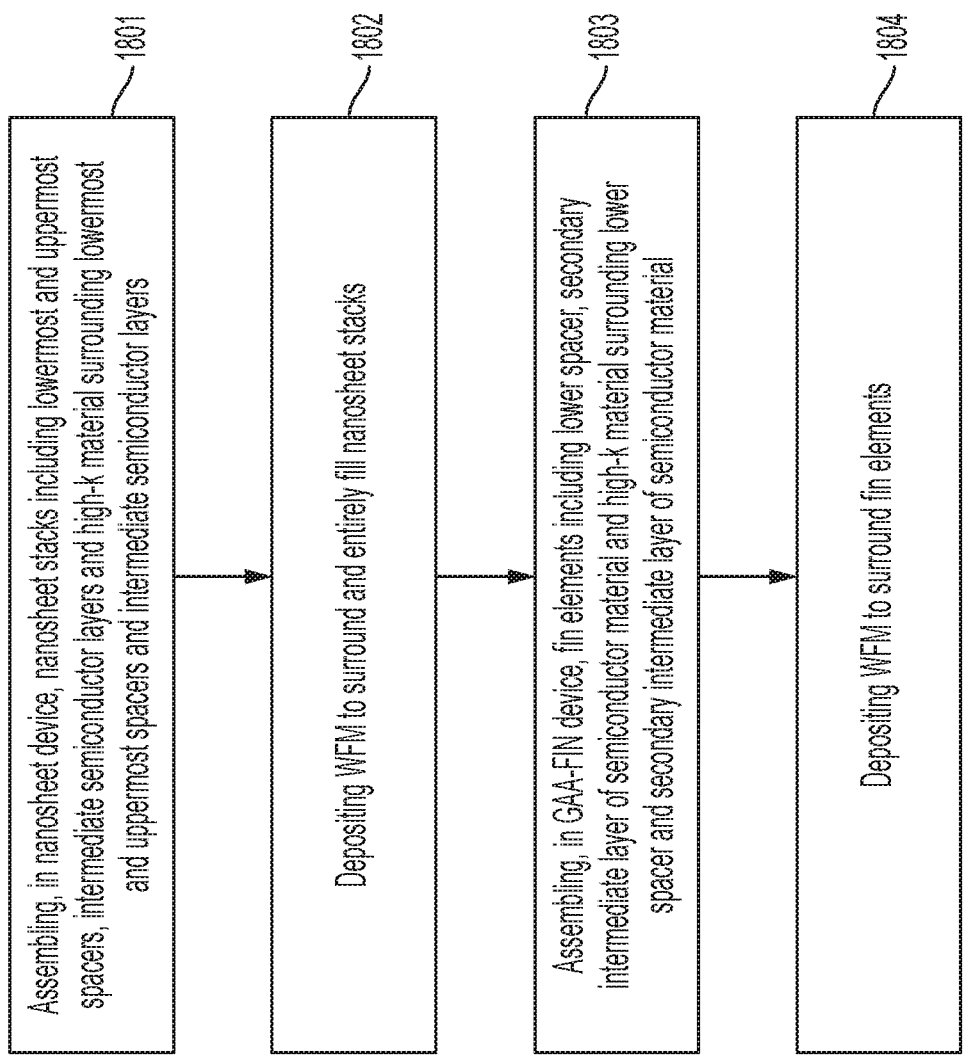
FIG. 18 is a flow diagram illustrating a method for fabricating a semiconductor device with nanosheet and gate-all-around FIN-shaped (GAA-FIN) devices in accordance with embodiments of the present invention.

With reference to FIG. 18, a method for fabricating a semiconductor device with nanosheet and gate-all-around FIN-shaped (GAA-FIN) devices as described above is provided. The method includes assembling, in the nanosheet device, nanosheet stacks including lowermost and uppermost spacers, intermediate semiconductor layers and high-k dielectric material surrounding the lowermost and uppermost spacers and the intermediate semiconductor layers (1801) and depositing work function metal (WFM) to surround and entirely fill the nanosheet stacks (1802). The method further includes assembling, in the GAA-FIN device, fin elements including a lower spacer, a secondary intermediate layer of semiconductor material and high-k dielectric material surrounding the lower spacer and the secondary intermediate layer of semiconductor material (1803) and depositing WFM to surround the fin elements (1804). The depositing of the WFM is executed such that a thickness of the WFM of the nanosheet stacks exceeds a thickness of the WFM of the fin elements.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   a nanosheet device comprising n- and p-type field effect transistor (nFET and pFET) sections, each of which comprises:
      nanosheet stacks comprising lowermost and uppermost spacers, intermediate semiconductor layers and dielectric material surrounding the lowermost and uppermost spacers and the intermediate semiconductor layers; and
      work function metal (WFM) surrounding the nano sheet stacks and entirely filling suspension regions thereof; and
   a gate-all-around FIN-shaped (GAA-FIN) device comprising nFET and pFET sections, each of which comprises:
      fin elements comprising a lower spacer, a secondary intermediate layer of semiconductor material and dielectric material surrounding the lower spacer and the secondary intermediate layer of semiconductor material; and
      WFM surrounding the fin elements;
      wherein a thickness of the WFM entirely filling suspension regions of the nanosheet stacks exceeds a thickness of the WFM surrounding the fin elements.

2. The semiconductor device according to claim 1, wherein the nanosheet device comprises multiple nanosheet devices and the GAA-FIN device comprises multiple sets of the fin elements.

3. The semiconductor device according to claim 1, wherein adjacent ones of the lowermost and uppermost spacers and the intermediate semiconductor layers are spaced at about ~7 nm from one another.

4. The semiconductor device according to claim 1, wherein a voltage threshold of the nanosheet device is lower than a voltage threshold of the GAA-FIN device.

5. The semiconductor device according to claim 1, wherein the nanosheet device comprises an extremely-low voltage threshold (XLVT) device as compared to the GAA-FIN device.

6. The semiconductor device according to claim 1, wherein:
- the WFM of each nanosheet stack in the nFET section comprises first and second WFM and the WFM of each nanosheet stack in the pFET section comprises the second WFM;
- the WFM of each fin element in nFET section comprises first and second WFM and the WFM of each fin element in the pFET section comprises the second WFM;
- a thickness of the first WFM of each nanosheet stack exceeds a thickness of the first WFM of each fin element; and
- a thickness of the second WFM in each nanosheet stack exceeds a thickness of the second WFM of each fin element.

* * * * *